United States Patent [19]

Lobastov

[11] Patent Number: 4,584,526

[45] Date of Patent: Apr. 22, 1986

[54] COMBINATION CONTINUITY AND LIVE CIRCUIT PATH TESTER

[76] Inventor: George S. Lobastov, 462 17th Ave., San Francisco, Calif. 94121

[21] Appl. No.: 461,735

[22] Filed: Jan. 28, 1983

[51] Int. Cl.[4] .................... G01R 31/02

[52] U.S. Cl. .................... 324/133

[58] Field of Search .................... 324/133, 51, 52; 340/641, 650, 652

[56] References Cited

U.S. PATENT DOCUMENTS

| | | | |
|---|---|---|---|
| 4,005,365 | 1/1977 | Berger | 324/133 |
| 4,207,517 | 6/1980 | Bloxam | 324/133 X |
| 4,210,862 | 7/1980 | Koslar | 324/133 X |
| 4,214,200 | 7/1980 | Hollander | 324/133 X |
| 4,225,817 | 9/1980 | Kahlden | 324/133 |
| 4,366,434 | 12/1982 | Ellis | 324/133 X |

*Primary Examiner*—Stanley T. Krawczewicz
*Assistant Examiner*—Jose M. Solis
*Attorney, Agent, or Firm*—Limbach, Limbach & Sutton

[57] ABSTRACT

A device is disclosed for testing electrical circuits. More particularly, a device is disclosed which operates to give a visual indication of both continuity and a live circuit path. The device includes a hollow casing having a conductive probe mounted at one end. A ground wire is connected to the opposed end of the casing. The testing circuit of the subject invention is disposed within the casing. The testing circuit includes a first light-emitting diode (LED) connected in a manner to pass electrical current between the probe and the ground. A second LED is provided which is connected in opposite polarity. A battery is provided to power the second LED. The battery and second LED are connected in parallel with the first LED. In operation, the first LED will be illuminated when there is a live circuit, while the second LED will be illuminated if the circuit is continuous. Neither of the LED's will be illuminated if the circuit is broken.

4 Claims, 4 Drawing Figures

2
10
46
42
20
26
22
46
42
P
24
28
G
22
46
20
48
42
42
10
44
46
3
10
46
48
20
50
60
68
64
22
46
44
66
26
24
28

40
46
46
48
50
22
24
28
42
42
44

COMBINATION CONTINUITY AND LIVE CIRCUIT PATH TESTER

DESCRIPTION

1. Technical Field

The subject invention relates to a new and improved circuit tester. More particularly, a test device is disclosed which is capable of simultaneously detecting either a live circuit path or continuity in a circuit path.

2. Background Art

In the prior art, a variety of electrical testing devices have been developed for analyzing circuit paths. A vast majority of the devices are relatively complex and expensive and are capable of providing quantitative measurements relating to the construction of a circuit. There also exists another class of devices which are relatively simple in construction and perform only one or two functions. For example, there are devices available which are only capable of determining whether a circuit path is either continuous or broken. The latter class of devices while relatively unsophisticated, are nonetheless used quite extensively in the repair of electrical wiring in vehicles, such as automobiles. As can be appreciated, in automotive wiring repairs, the operator is rarely interested in the construction of the circuit being tested, but merely whether a wire is broken or connected to the battery.

The latter class of testing devices have many similarities. For example, the devices are usually compact, permitting their use in hard to reach areas. Furthermore, these devices must be relatively simple in construction and inexpensive. Finally, it is desirable that the devices include some form of illuminated indicator which may be seen in low light conditions. The latter provision is particularly advantagenous where the operator is working underneath or within the darkened engine compartment of an automobile.

In the past, a number of simple testers have been developed which can perform more than one function. Two examples of such devices can be found in U.S. Pat. No. 2,916,699, issued Dec. 8, 1959 to Eisenberg and U.S. Pat. No. 3,227,948, issued Jan. 4, 1966 to Cheshire. The devices disclosed in the latter patents are capable of determining whether a circuit path is continuous. Each device includes a conductive probe and a ground connection. If the ground connection and probe are connected to a continuous circuit path, a battery in the device will energize a light bulb. Each of these devices is also capable of acting as a flashlight, thus providing the dual function.

Another prior art device which has greater testing utility may be found in U.S. Pat. No. 2,763,834, issued Sept. 18, 1956 to MacDonald. The MacDonald device is capable of testing the continuity of a circuit path. In addition, the MacDonald device can also be manipulated in a manner to provide an indication of a live circuit. The MacDonald device is defined by an elongated hollow casing having a conductive probe mounted on one end. A negative ground connection is connected to the opposed end of the casing. A bulb is provided to provide a visual indication of the tested condition. In one mode, a pair of batteries are mounted within the casing for illuminating the bulb when a continuous circuit path is detected. If the operator wishes to test for a live circuit, the batteries are first removed and a central pin, which is connected to ground, must be inserted within the casing. When the device has been altered in this manner, current present in a live circuit will power the bulb, giving a visual indication of the presence of the current.

Thus, the device disclosed in MacDonald is capable of testing for both continuity and a live circuit path. However, as can be appreciated, the device in MacDonald has an obvious shortcoming. More particularly, the device is incapable of testing for both conditions simultaneously. Rather, if the device is set up to test for continuity, it will not provide a separate signal indicating a live circuit. Furthermore, if the device is set up to test a live circuit, it will not provide an indication that the circuit path is continuous.

Accordingly, it is an object of the subject invention to provide a new and improved testing device which is capable of simultaneously testing for both continuity and a live circuit path.

It is another object of the subject invention to provide a new and improved combination tester which is both compact and easy to manufacture.

It is a further object of the subject invention to provide a new and improved combination tester which will provide separate visual indications for a continuous circuit path, a live circuit path and a broken or discontinuous circuit path.

It is still another object of the subject invention to provide a new and improved combination circuit tester which utilizes light-emitting diodes.

DISCLOSURE OF INVENTION

In accordance with these and many other objects, the subject invention provides for a new and improved combination testing device. The device includes an elongated hollow casing having a conductive probe mounted at one end thereof. A ground connection is mounted to the opposed end of the casing and terminates with an alligator-type clip.

In accordance with the subject invention, a new and improved circuit means is provided which is located within the casing. The circuit means includes a first rectifying means connected in a manner to pass current from the probe to the ground. An electrical indicator is connected in series with the first rectifying means. The indicator is intended to provide a visual signal when current passes from the probe to the ground. A second rectifying means is also provided which is connected in a manner to pass current from the ground to the probe. A second electrical indicator and a biasing means, such as a battery, is connected in series with the second rectifying means. The latter three elements are connected in parallel with the first rectifying means and first electrical indicator.

In operation, the ground of the device is connected to a ground point in the circuit path to be tested. The conductive probe is then placed in contact with any other point in the circuit path. The first indicator means will provide a visual signal if the circuit path is live. The second indicator means will provide a visual signal if the circuit path is continuous. If the circuit path is broken, neither of the indicators will be actuated. Thus, the subject device is capable of simultaneously testing for three conditions.

In the preferred embodiment, a light-emitting diode is used to define the combination of the rectifying means and the indicator means. By providing different colored light-emitting diodes (LED's), the operator can readily tell which condition is being signaled.

Further objects and advantages of the subject invention will become apparent from the following detailed description taken in conjunction with the drawings in which:

BEST MODE FOR CARRYING OUT THE INVENTION

Figures 1, 2, 3, 4:
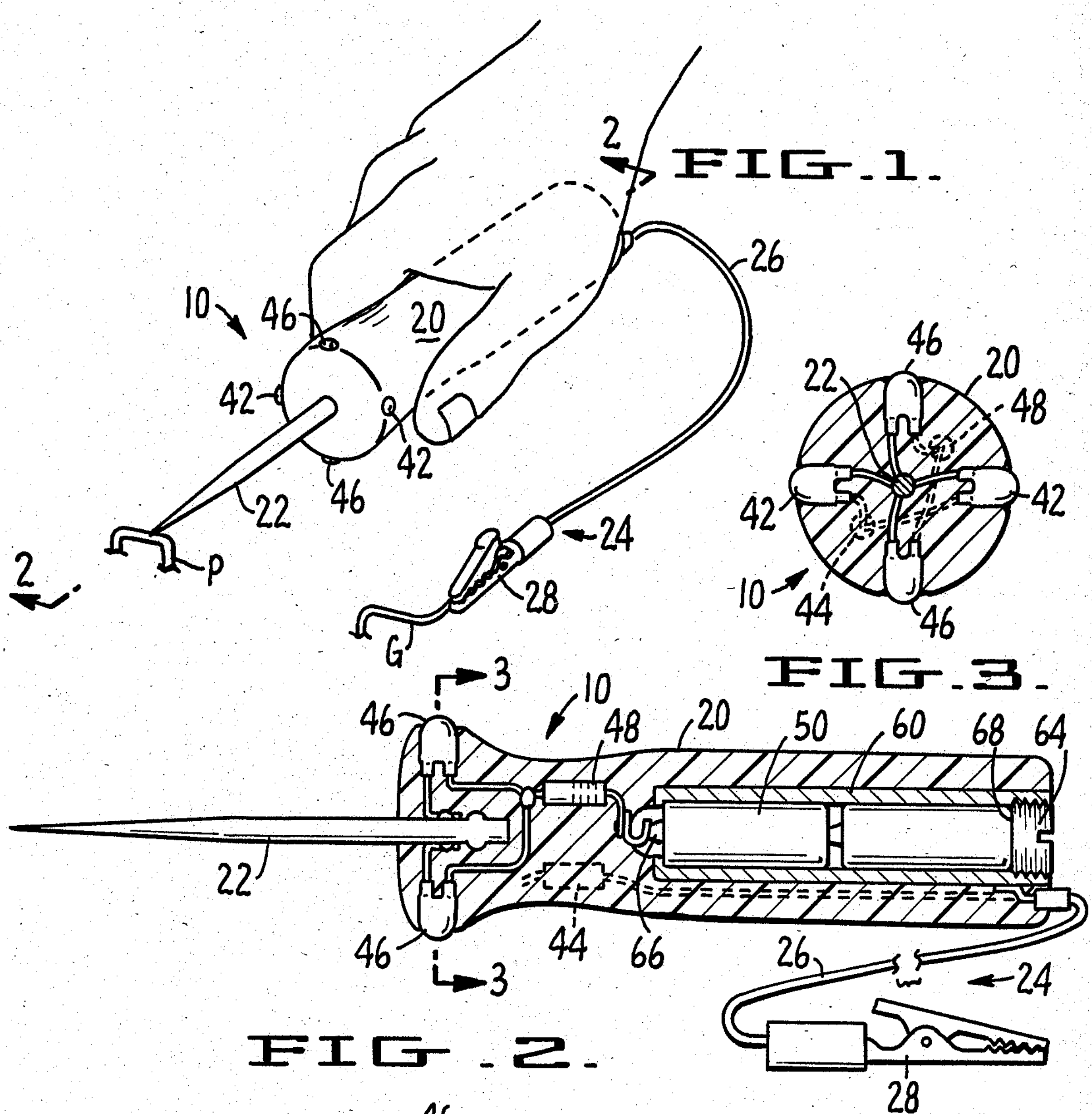
FIG. 1 is a perspective view of the new and improved circuit tester of the subject invention.
FIG. 2 is a cross-sectional view of the new and improved circuit tester of the subject invention taken along the line 2—2 in FIG. 1.
FIG. 3 is a cross-sectional view of the new and improved circuit ,tester of the subject invention taken along the line 3—3 in FIG. 2.
FIG. 4 is schematic diagram of the circuit utilized in the new and improved circuit tester of the subject invention.

Referring to FIGS. 1 through 4, the testing device 10 of the subject invention will now be described in greater detail. The testing device 10 is intended to be compact, of relatively simple construction and capable of being operated in tight, dark areas. By this arrangement, the device 10 may be readily used to work on vehicle electrical systems, such as automobiles.

The tester 10 includes an elongated casing 20 having an interior adapted to receive the circuit of the subject invention. An elongated, conductive probe 22 is mounted at one end of the casing 20. A ground means 24 is mounted adjacent the remaining end of the casing. The ground means 24 preferably consists of a conductive insulated wire 26, one end of which is in electrical contact with the circuit located within the casing. The remaining end of the ground means may be defined by an alligator clip 28 to facilitate connection to the circuit to be tested, as illustrated in FIG. 1.

As discussed above, the tester of the subject invention is capable of simultaneously testing for continuity and a live circuit path. These tests are extremely useful in diagnosing faulty wiring conditions in vehicles, such as automobiles, boats or air-craft. More specifically, many vehicles are designed such that the metal chassis constitutes an electrical ground. Power is distributed from the vehicle battery to various accessories, such as the lights, horn, or radio. When diagnosing a faulty circuit, it is frequently necessary to determine if battery power is reaching the accessory. To make this determination, the ground means 24 is connected to any metal portion G of the chassis. The probe 22 is then placed in contact with the wire lead P which is thought to carry the current. If the circuit path is live, current will flow through the tester and supply power for illuminating a signalling device. If the circuit is broken, no indication will be given.

A third possibility exists, namely, that the wire lead being probed is actually connected to ground. In the latter case, while there is continuity between the probe and ground, the battery is not part of the circuit path such that there is no outside power available for the tester. Thus, in contrast to a live circuit path, a power source must be provided to generate an indication of continuity. These two different requirements hindered the development of a simple device which could test both conditions simultaneously. This difficulty is overcome in the tester of the subject invention.

The above described result is achieved by the circuit means 40 illustrated in FIG. 4. Circuit means 40 includes a pair of first light-emitting diodes (LED's) 42 connected in parallel and arranged to pass current from probe 22 to ground means 24. As is well known in the art, a light-emitting diode will pass current in only one direction. In addition, when current flows through an LED, visible light will be generated. The use of LED's in the subject circuit is thought to be the most efficient and inexpensive way of performing the rectifying and signalling function. However, it is to be understood that each LED could be replaced by a combination of a rectifying means connected in series with an electrical indicator, such as a light bulb.

In the preferred embodiment, a current limiting resistor 44 is connected in series with the LED's 42, between probe 22 and ground means 24. The value selected for resistor 44 is dependent upon the voltage system in the vehicle to be tested. For example, in a typical 12 volt automobile electrical system, resistor 44 should be 220 ohms. Where an automobile utilizes a 6 volt system, resistor 44 should be reduced to 110 ohms. In contrast, in vehicles such as aircraft and tanks, utilizing a 24 volt battery system, resistor 44 should be raised to 440 ohms. As will be discussed more fully hereinbelow, when the tester is connected to a live circuit path, current will flow from probe 22 through LED's 42 and out to ground means 24, resulting in the emission of light energy from LED's 42.

The subject circuit 40 further includes a second pair of light emitting diodes 46, connected in parallel. LED's 46 are arranged in a manner to pass current from ground means 24 to probe 22. As can be appreciated, the polarity of LED's 46 is exactly opposite to that of LED's 42. A resistor 48 and a biasing means 50 are connected in a series with the LED's 46. Biasing means 50 preferably consists of a battery having its positive terminal directed towards LED's 46. The combination of LED's 46, resistor 48 and battery 50 is connected in parallel with LED's 42 and resistor 44.

Having outlined the components of the circuit means 40 of the subject invention, its operation will now be discussed in detail. As pointed out above, in use, ground means 24 is connected to the ground G of the circuit path to be tested. Probe 22 is then placed in contact with the point P of the circuit to be tested. In the situation where the circuit path is live, current will enter tester through probe 22, pass through LED's 42 and exit the ground means 24. This current flow will cause LED's 42 to generate light. As can be appreciated, due to the reverse polarity of LED's 46, no current will pass through the latter diodes and they will remain dark.

In the second testing situation, the point P is connected directly to ground G. This condition arises in a number of situations. For example, an operator may be trying to determine if an accessory is properly grounded and continuity is expected. On the other hand, this condition can be unexpected, as when an apparently live contact point has been inadvertently shorted to ground.

In either case, where continuity exists, LED's 46 will be illuminated, while LED's 42 will remain dark. This result is achieved due to the biasing force provided by battery 50. More specifically, when a continuous circuit path exists between probe 22 and ground means 24, battery 50 will provide the power necessary to drive LED's 46. Because of the resistance existing along the path of LED's 42, no current will travel through LED's 42. Thus, only LED's 46 will become illuminated when the circuit path is continuous.

The third possible test condition is a broken circuit path. This condition is electrically identical to the situation where the tester is unconnected to an outside circuit, as illustrated in FIG. 4. In this state, no current will flow through the circuit and all the LED's will remain dark. To insure this result, it is necessary to limit the voltage supplied by battery 50 so that it is incapable of driving all four LED's. As can be appreciated, if the battery 50 was powerful enough to overcome the resistance of all four LED's, current would flow through the entire circuit 40. The battery must, of course, be powerful enough to drive the two LED's 46 during the continuity test. To satisfy these parameters in the illustrated embodiment, battery 50 is provided with a potential of three volts and resistor 48 is provided with a 24 ohms resistance.

In addition to low cost, the use of LED's in the subject circuit provides another advantage. More particularly, because each LED has a relatively high resistance to low voltage, the circuit does not require a switch to prevent the battery from being drained. In contrast, if a rectifier and bulb combination were substituted for the LED's, it would be desirable to add a switch to the circuit to preserve the batteries.

Having described the circuit means 40 of the subject invention, its incorporation within the testing device 10 of the subject invention will now be discussed. Referring to FIGS. 1 through 3, it will be seen that LED's 42 and 46 are mounted about the periphery of the casing 20, near probe 22. More particularly, the individual LED's are disposed in each of the four quadrants about the circumference of the casing. As illustrated in FIG. 3, the first pair of LED's 42 are mounted 180 degrees apart in two quadrants. Similarly, the remaining pair of LED's 46 are also mounted 180 degrees apart in the remaining two quadrants. By this arrangement, one of the two LED's in each pair will be readily visible to the user from any orientation.

In the preferred embodiment, the colors of the LED's are arranged to facilitate the determination of the condition being tested. For example, in the preferred embodiment, LED's 42 emit red light, while LED's 46 emit green light. Thus, in operation, when the red LED's 42 are illuminated, it will readily indicate a live circuit. In contrast, the green LED's 46 are illuminated when a continuous circuit path is diagnosed.

As illustrated in FIGS. 2 and 3, one terminal of each LED is electrically connected directly to probe 22. The remaining leads of each LED 42 are connected to resistor 44 (shown in phantom). The free lead of resistor 44 is electrically connected to wire 26 of ground means 24.

LED's 46 are connected in series with a biasing means. As illustrated in FIG. 2, casing 20 is provided with an interior metallic battery compartment 60 for storing batteries 50. In the preferred embodiment batteries 50 are "N" size batteries, each of 1.5 volts potential. Batteries 50 are inserted within the compartment 60 such that the positive terminals thereof are directed towards the forward end of the casing 20, with the leading positive terminal 66 placed in electrical contact with resistor 48. Resistor 48 is in turn connected to the free leads of LED's 46. The rear end of the battery compartment 60 is sealed by a threaded plug 64. Plug 64 is electrically conductive and provides a current path from the negative terminal 68 of batteries 50 to the metal battery compartment 60. As is illustrated in the FIG. 2, ground means 24 is in electrical contact with battery compartment 60.

In summary, there has been provided a new and improved device for testing electrical circuits. The device 10 includes an elongated hollow casing 20 with a conductive probe 22 mounted at one end thereof. A ground means 24 is connected to the opposed end of the casing. An electrical circuit 40 is disposed within the casing and includes a first LED 42 connected in a manner to pass current from the probe 22 to the ground means 24. A second LED 46 is also provided which is connected between the probe and ground means 24 in opposite polarity. A biasing means 50 is connected in series with the second LED 46. The biasing means 50 and LED 46 are connected in parallel with the LED 42. In operation, ground means 24 is connected to a ground point G, while probe 22 is placed in contact with another point P in the circuit path. The first LED 42 will provide a visual indication if the circuit path is live. In contrast, if the circuit path is merely a continuous circuit, the second LED 46 will be illuminated. Finally, if the circuit path is broken, neither of the LED's will be illuminated.

While the subject invention has been described with reference to a preferred embodiment, it is to be understood that various other changes and modifications could be made therein, by one skilled in the art, without varying from the scope and spirit of the subject invention as defined by the appended claims.

I claim:

1. A combination continuity and live circuit path tester comprising:

an elongated generally cylindrical casing;

a conductive probe mounted at one end of said casing;

ground means connected to said casing;

first pair of light-emitting diodes connected in parallel to each other and in a manner to pass current between said probe and ground means;

second pair of light-emitting diodes connected in parallel to each other and in a manner to pass current between said probe and ground means in the opposite direction from said first pair, said light-emitting diodes being respectively disposed in four quadrants about the periphery of said casing with said first pair being disposed 180 degrees apart in two quadrants and said second pair being in the remaining two quadrants spaced 180 degrees apart; and biasing means connected in series with and powering said second pair of light-emitting diodes, said biasing means and said second pair of light-emitting diodes being connected in parallel with said first pair of light-emitting diodes whereby in operation, said ground means is connected to a ground point in the circuit path to be tested and said conductive probe is placed in contact with another point in the circuit path, such that said first pair of light-emitting diodes will generate light if the circuit path is live, while said second pair of light-emitting diodes will generate light if the circuit path is continuous and no light will be generated if the circuit path is broken.

2. A combination tester as recited in claim 1 wherein said first pair of light-emitting diodes are of one color and said second pair of light-emitting diodes are of another color.

3. A combination tester as recited in claim 1 wherein said biasing means is defined by a battery.

4. A combination tester as recited in claim 3 where the voltage produced by said battery is sufficient to drive current through said second rectifying means and said second electrical indicator means when a continuous circuit path is being tested but insufficient to drive current through said electrical circuit means of said tester when no circuit path is being tested.

* * * * *